(12) United States Patent
Wang et al.

(10) Patent No.: US 11,804,494 B2
(45) Date of Patent: Oct. 31, 2023

(54) ARRAY SUBSTRATE AND PREPARATION METHOD THEREOF, DISPLAY PANEL AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Haitao Wang, Beijing (CN); Jun Cheng, Beijing (CN); Ming Wang, Beijing (CN); Qinghe Wang, Beijing (CN); Jun Wang, Beijing (CN); Tongshang Su, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 72 days.

(21) Appl. No.: 17/349,164

(22) Filed: Jun. 16, 2021

(65) Prior Publication Data
US 2022/0173125 A1    Jun. 2, 2022

(30) Foreign Application Priority Data
Nov. 30, 2020  (CN) .......................... 202011372499.0

(51) Int. Cl.
*H01L 27/12*    (2006.01)
*H01L 27/02*    (2006.01)

(52) U.S. Cl.
CPC ........ *H01L 27/124* (2013.01); *H01L 27/0266* (2013.01); *H01L 27/0288* (2013.01); *H01L 27/127* (2013.01); *H01L 27/1237* (2013.01); *H01L 27/1255* (2013.01)

(58) Field of Classification Search
CPC ............... H01L 27/124; H01L 27/0266; H01L 27/0288; H01L 27/1237; H01L 27/1255; H01L 27/127
USPC .......................................................... 257/59
See application file for complete search history.

(56) References Cited

U.S. PATENT DOCUMENTS 9,570,473 B2 *   2/2017  Wang .................... H01L 27/124
2020/0279869 A1 *  9/2020  Ai ......................... H01L 27/124

\* cited by examiner

*Primary Examiner* — Ori Nadav
(74) *Attorney, Agent, or Firm* — IPRO, PLLC

(57) ABSTRACT

The disclosure discloses an array substrate and a preparation method thereof, a display panel and a display device. The array substrate includes: a substrate, and a first metal layer, a metal oxide layer and a second metal layer which are sequentially stacked and isolated from each other on the substrate; the first metal layer includes a light shading metal, a first electrode, and an anti-static line; the metal oxide layer includes a first active layer; the second metal layer includes a gate line and a second electrode; the gate line is connected with the anti-static line through a first TFT, one of the first electrode and the second electrode forms the source and drain electrodes of the first TFT, and the other forms the gate electrode of the first TFT; and the source is electrically connected with the gate line, and the drain is electrically connected with the anti-static line.

18 Claims, 3 Drawing Sheets

ARRAY SUBSTRATE AND PREPARATION METHOD THEREOF, DISPLAY PANEL AND DISPLAY DEVICE

CROSS-REFERENCE TO RELATED APPLICATION

This application claims the priority of Chinese Patent Application No. 202011372499.0, filed with the China National Intellectual Property Administration on Nov. 30, 2020, which is hereby incorporated by reference in its entirety.

FIELD

The present invention relates to the technical field of display, in particular to an array substrate and a preparation method thereof, a display panel, and a display device.

BACKGROUND

In the design of the existing OLED substrate structure, an anti-static structure will be set, however, the anti-static structure in the prior art is more complex, the preparation process spans more processes, and the preparation of the anti-static structure can generally be completed after the process of a plurality of conductive layers, to achieve the effect of evacuating the static electricity, therefore, in the preparation process of some metal layers, larger static electricity accumulated in the dry etching or exposure process cannot be evacuated, thereby easily causing electrostatic breakdown.

SUMMARY

Embodiments of the present disclosure provide an array substrate and a preparation method thereof, a display panel, and a display device.

In a first aspect, the embodiments of the present disclosure provides an array substrate, including:
  a substrate, a first metal layer, a metal oxide layer and a second metal layer;
  the first metal layer, the metal oxide layer and the second metal layer are sequentially stacked and isolated from each other on the substrate;
  the first metal layer includes a light shading metal, a first electrode, and an anti-static line arranged in a peripheral wiring area of the substrate; the metal oxide layer includes a first active layer; and the second metal layer includes a gate line and a second electrode;
  the gate line is connected with the anti-static line through the first TFT, the first electrode, the first active layer and the second electrode constitute the first TFT, one of the first electrode and the second electrode forms the source and drain electrodes of the first TFT, and another one of the first electrode and the second electrode forms the gate electrode of the first TFT;
  the first active layer is connected with the source and drain electrodes of the first TFT through a conductive structure, and a distance between a surface, facing away from the substrate, of the conductive structure and the substrate is less than or equal to a distance between a surface, face away from the substrate, of the second metal layer and the substrate;
  the source electrode of the first TFT is electrically connected with the gate line, and the drain electrode of the first TFT is electrically connected with the anti-static line; and
  a first capacitor is formed between the gate electrode of the first TFT and the source electrode of the first TFT, and a second capacitor is formed between the gate electrode of the first TFT and the drain electrode of the first TFT.

The above array substrate includes a substrate, and the substrate is divided into a display area and a peripheral wiring area arranged on the circumference of the display area; a first metal layer is arranged on the substrate, and the first metal layer is used to form a light shading metal, a first electrode, and an anti-static line; and the light shading metal, the first electrode and the anti-static line are prepared by the same layer of metal, and the light shading metal is arranged in the display area and can play a role of light shading, and the first electrode and the anti-static line are set in the peripheral wiring area.

Further, a metal oxide layer is formed on the first metal layer, the metal oxide layer is isolated from the first metal layer, the metal oxide layer includes a first active layer, a second metal layer is arranged above the metal oxide layer, and the first metal layer is isolated from the metal oxide layer, and the material of the second metal layer can be copper or aluminum, or other conductive metals, which is not limited in the present embodiment;
  the second metal layer is used to form the gate line and the second electrode, the gate line is connected with the anti-static line through a first TFT, and the first electrode, the first active layer and the second electrode constitute the first TFT, and one of the first electrode and the second electrode forms the source and drain electrodes of the first TFT, that is, forming the source and the drain electrodes of the first TFT, and the other forms the gate electrode of the first TFT.

The first active layer and the source and drain electrodes of the first TFT may be connected through a conductive structure. Relative to the substrate, the top surface of the conductive structure is lower than the top surface of the second metal layer, or the top surface of the conductive structure is flush with the top surface of the second metal layer, for example, the conductive structure may be a conductive layer formed before the formation of the second metal layer or a part of the second metal layer.

Since the first TFT is formed by the first electrode, the first active layer and the second electrode, the conductive structure is also part of the first TFT, and the conductive structure can play a role of connecting the upper layer with the lower layer, then the conductive structure is part of one of the first active layer or the second electrode; further, the source electrode of the first TFT is electrically connected with the gate line, the drain electrode of the first TFT is electrically connected with the anti-static line, a first capacitor is formed between the gate electrode of the first TFT and the source electrode of the first TFT6, and a second capacitor is formed between the gate electrode of the first TFT and the drain electrode of the first TFT. For example, the first TFT is connected between the gate line and the anti-static line.

When the gate line has more static electricity, the source electrode of the first TFT is electrically connected with the gate line, and the voltage of the source electrode of the first TFT is the same as the voltage of the gate line, and when the gate line accumulates more static electricity and the voltage of the gate line is higher, the source voltage of the first TFT is higher; a first capacitor is formed between the first TFT and the gate electrode of the first TFT, and when the gate electrode of the first TFT forms a high potential, the first TFT can be opened to communicate the source with the drain electrode of the first TFT, and further the static electricity of the gate line can be evacuated to the anti-static line.

Optionally, the first electrode forms the source and drain electrodes of the first TFT, and the second electrode forms the gate electrode of the first TFT.

Optionally, the first active layer includes a channel region opposite to the gate electrode of the first TFT, and a first conductorization region and a second conductorization region arranged on two sides of the channel region, respectively;

the first conductorization region and the second conductorization region constitute the conductive structure, the first conductorization region is connected with the source electrode of the first TFT, and the second conductorization region is connected with the drain electrode of the first TFT.

Optionally, the first electrode forms the gate electrode of the first TFT, and the second electrode forms the source and drain electrodes of the first TFT.

Optionally, the first active layer includes a channel region opposite to the gate electrode of the first TFT, and a first conductorization region and a second conductorization region arranged on two sides of the channel region, respectively;

the second electrode is formed with a first connecting metal and a second connecting metal, the first connecting metal and the second connecting metal constitute the conductive structure, the first connecting metal and the second connecting metal constitute the conductive structure, the first connecting metal is connected with the first conductorization region, and the second connecting metal is connected with the second conductorization region.

Optionally, the gate electrode of the first TFT is partially overlapped with the source electrode of the first TFT to form the first capacitor, and the gate electrode of the first TFT is partially overlapped with the drain electrode of the first TFT to form the second capacitor.

Optionally, the anti-static line is a ring-shaped line, and the anti-static line is set around a display area of the array substrate.

Optionally, an orthographic projection, on the substrate, of the gate line and an orthographic projection, on the substrate, of the anti-static line have an overlapped area, and a hollow structure is arranged at the overlapped area.

Optionally, the array substrate further includes:
a buffer layer arranged between the first metal layer and the metal oxide layer; and
a gate insulating layer arranged between the metal oxide layer and the second metal layer.

Optionally, the metal oxide layer further includes a second active layer disposed in a sub-pixel unit of the array substrate;
the second metal layer further includes a first gate electrode arranged in the sub-pixel unit and opposite to the second active layer; and
an interlayer insulating layer is disposed on the second metal layer, a third metal layer is disposed on the interlayer insulating layer, and the third metal layer includes a first source electrode and a first drain electrode electrically connected with the second active layer.

In the second aspect, the embodiments of the present disclosure further provide a display panel, including any arbitrary array substrate provided in the above technical solution.

In the third aspect, the embodiments of the present disclosure further provide a display device, including any arbitrary display panel provided in the above technical solution.

In the fourth aspect, the embodiments of the present disclosure further provide a method for preparing any arbitrary array substrate provided in the above technical solution, including:
forming a first metal layer on the substrate, the first metal layer includes a light shading metal, a first electrode, and an anti-static line arranged in a peripheral wiring area of the substrate;
forming a metal oxide layer above the first metal layer, the metal oxide layer is isolated from the first metal layer, and the metal oxide layer includes a first active layer;
forming a second metal layer above the first metal layer, the second metal layer is isolated from the metal oxide layer, and the second metal layer includes a gate line and a second electrode;
the gate line is connected with the anti-static line through the first TFT, the first electrode, the first active layer and the second electrode constitute the first TFT, one of the first electrode and the second electrode forms source and drain electrodes of the first TFT, and another one of the first electrode and the second electrode forms the gate electrode of the first TFT; the first active layer is connected with the source and drain electrodes of the first TFT through a conductive structure, and a distance between a surface, facing away from the substrate, of the conductive structure and the substrate is less than or equal to a distance between a surface, facing away from the substrate, of the second metal layer and the substrate; the source electrode of the first TFT is electrically connected with the gate line, and the drain electrode of the first TFT is electrically connected with the anti-static line; and a first capacitor is formed between the gate electrode of the first TFT and the source electrode of the first TFT, and a second capacitor is formed between the gate electrode of the first TFT and the drain electrode of the first TFT.

REFERENCE NUMERALS

Figure 1:
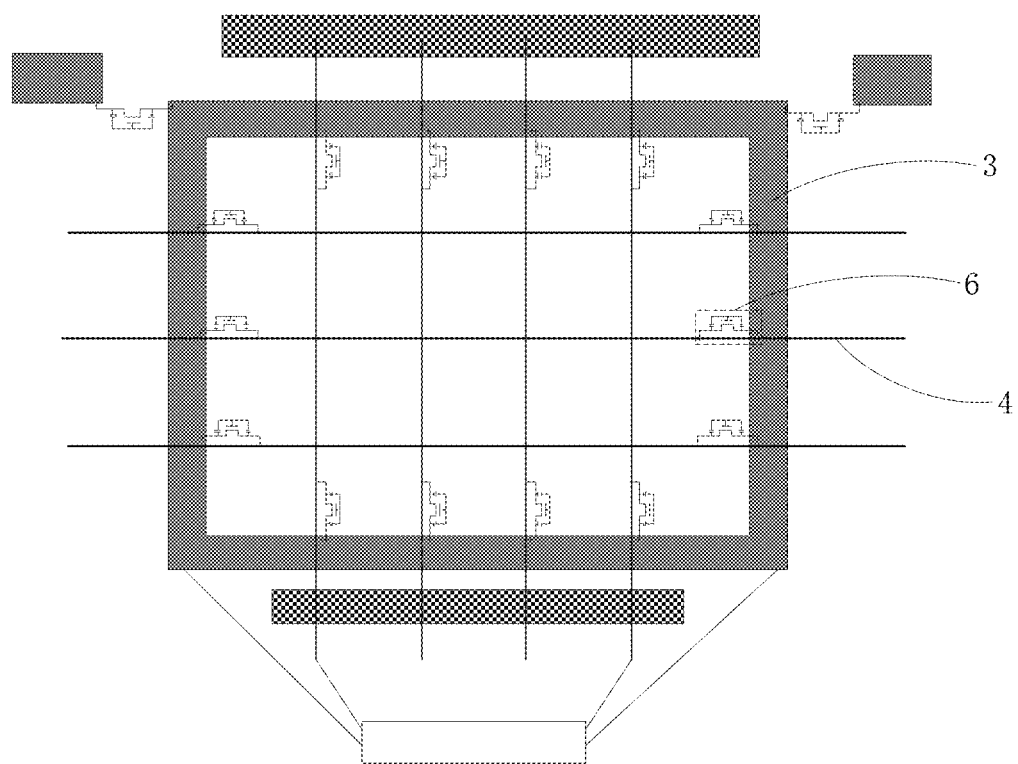
FIG. 1 is a structural schematic diagram of a top view of an array substrate provided in the embodiment of the present disclosure.

Reference numerals: 1—array substrate; 2—first electrode; 3—anti—static line; 4—gate line; 5—second electrode; 6—first TFT; 7—hollow structure; 8—first connecting metal; 9—second connecting metal; 10—buffer layer; 11—first active layer; 12—gate insulating layer; 13—passivation layer; 14—first conductorization region; 15—second conductorization region; 16—light shading metal; 17—first source electrode; 18—first drain electrode; 19—interlayer insulating layer; 20—first gate electrode; 21—second active layer.

DETAILED DESCRIPTION OF THE EMBODIMENTS

A clear and complete description will be given below on the technical solutions in the embodiments of the present disclosure in combination with the accompanying drawings in the embodiments of the present disclosure. Obviously, the described embodiments are only a part, but not all, of the embodiments of the present disclosure. Based on the embodiments in the present disclosure, all the other embodiments obtained by those skilled in the art without any creative effort shall all fall within the protection scope of the present disclosure.

As shown in FIGS. 1 to 3 and FIG. 6, embodiments of the present disclosure provide an array substrate, including: a substrate 1; and a first metal layer, a metal oxide layer, and a second metal layer which are sequentially stacked and isolated from each other on the substrate 1; the first metal layer includes a light shading metal, a first electrode 2, and an anti-static line 3.

The anti-static line 3 is arranged in a peripheral wiring area of the substrate; the metal oxide layer includes the first active layer 11; the second metal layer includes the gate line 4 and the second electrode 5; the gate line 4 is connected with the anti-static line 3 through the first TFT6, the first electrode 2, the first active layer 11 and the second electrode 5 constitute the first TFT6, one of the first electrode 2 and the second electrode 5 forms source and drain electrodes of the first TFT6, and the other of the first electrode 2 and the second electrode 5 forms a gate electrode of the first TFT6; the first active layer is connected with the source and drain electrodes of the first TFT through a conductive structure, and a distance between a surface, facing away from the substrate, of the conductive structure and the substrate is less than or equal to a distance between a surface, facing away from the substrate, of the second metal layer and the substrate; the source electrode of the first TFT6 is electrically connected with the gate line 4, and the drain electrode of the first TFT6 is electrically connected with the anti-static line 3; and a first capacitor is formed between the gate electrode of the first TFT6 and the source electrode of the first TFT6, and a second capacitor is formed between the gate electrode of the first TFT6 and the drain electrode of the first TFT6.

The above array substrate includes a substrate, and the substrate is divided into a display area and a peripheral wiring area arranged on the circumference of the display area, wherein a first metal layer is arranged on the substrate, and the first metal layer is used to form a light shading metal 16, a first electrode 2, and an anti-static line 3; wherein the light shading metal 16, the first electrode 2, and the anti-static line 3 are prepared by the same layer of metal, and the light shading metal 16 is arranged in the display area and can play a role of light shading, and the first electrode 2 and the anti-static line 3 are set in the peripheral wiring area.

In some embodiments, a metal oxide layer is formed on the first metal layer, the metal oxide layer is isolated from the first metal layer, the metal oxide layer includes a first active layer 11, a second metal layer is arranged on the metal oxide layer, and the second metal layer is isolated from the metal oxide layer, and the material of the second metal layer can be copper or aluminum, or other conductive metals, which is not limited in the present embodiment; the second metal layer is used to form the gate line 4 and the second electrode 5, the gate line 4 is connected with the anti-static line 3 through the first TFT6, and the first electrode 2, the first active layer 11 and the second electrode 5 constitute the first TFT6, one of the first electrode 2 and the second electrode 5 forms the source and drain electrodes of the first TFT6, that is, forming the source and drain electrodes of the first TFT6, and the other forms the gate electrode of the first TFT6, the first active layer may be connected with the source and drain electrodes of the first TFT through a conductive structure, relative to the substrate, the top surface of the conductive structure is lower than the top surface of the second metal layer, or the top surface of the conductive structure is flush with the top surface of the second metal layer, for example, the conductive structure is a conductive layer formed prior to the formation of the second metal layer or is part of the second metal layer.

Since the first TFT is formed by the first electrode 2, the first active layer and the second electrode 5, the conductive structure is also part of the first TFT, and the conductive structure can play a role of connecting the upper layer with the lower layer, then the conductive structure is part of one of the first active layer or the second electrode; further, the source electrode of the first TFT6 is electrically connected with the gate line 4, the drain electrode of the first TFT6 is electrically connected with the anti-static line 3, a first capacitor C1 is formed between the gate electrode of the first TFT6 and the source electrode of the first TFT6, and a second capacitor C2 is formed between the gate electrode of the first TFT6 and the drain electrode of the first TFT6. For, example, the first TFT 6 is connected between the gate line 4 and the anti-static line 3.

Further, when the gate line 4 has more static electricity, the source electrode of the first TFT 6 is electrically connected with the gate line 4, and the voltage of the first TFT 6 is the same as the voltage of the gate line 4, and when the gate line 4 accumulates more static electricity and the voltage of the gate line 4 is higher, the source voltage of the first TFT6 is higher. Further, a first capacitor C1 is formed between the first TFT6 and the gate electrode of the first TFT6. When the gate GT of the first TFT 6 forms a high potential, the first TFT6 can be opened to communicate the source with the drain electrode of the first TFT6, and further the static electricity of the gate line 4 can be evacuated to the anti-static line 3.

Accordingly, the substrate is provided with a plurality of gate lines, each gate line is provided with a first TFT to be connected with the anti-static line, and as to one gate line, a first TFT can be arranged at each end of the gate line to be connected with the anti-static line, or a first TFT can be arranged at one end of the gate line to be connected with the anti-static line, or three first TFTs can be arranged, each of the first TFTs is configured to connect the gate line with the anti-static line.

It should be noted that the number and position of the first TFTs between each gate line and the anti-static line can be set according to actual needs, which will not be limited in the present embodiment.

In the above array substrate structure, after the formation of the layer of the gate line 4, the anti-static line 3 in the anti-static structure and the first TFT6 connecting the anti-static line 3 and the gate line 4 are formed, the anti-static structure can form a communicated structure circuit only by relying on three conductive layers including a first metal layer, a metal oxide layer and a second metal layer, and the overall anti-static structure is relatively simple, and can effectively complete the evacuation of static electricity.

The anti-static structure in the embodiments of the present disclosure is simple and reliable, with less preparation process, and the anti-static structure can be formed earlier in the preparation process of the array substrate, which can play an effective role in evacuating the static electricity on the gate line 4. Therefore, the larger static electricity accumulated due to etching or exposure during the preparation process can be evacuated by the formed anti-static structure from the gate line 4 to the anti-static line 3, and the static electricity can be consumed by the anti-static line 3, so as to eliminate the static electricity, which can effectively avoid the phenomenon of short circuit caused by electrostatic breakdown in the part at which the gate in the sub-pixel unit is overlapped with the active layer in the preparation process, and can avoid electrostatic breakdown at the overlapping area between the anti-static line 3 and the gate line 4, to reduce the defect caused by short circuit between two layers of metal with an overlapping area, further effectively reduce the bright spot phenomenon caused by short circuit, and effectively improve the product yield. Moreover, after the completion of the product, the anti-static structure can play a role in electrostatic protection, so as to protect the circuit line in the product.

Therefore, in the above array substrate, the overall anti-static structure is simple and compact, the preparation process is less, with no need of spanning the preparation of multiple conductive layers, and when the gate line is formed, the anti-static structure is also formed, so that the static electricity accumulated in the dry etching or exposure process during the preparation process can be evacuated from the gate line to the anti-static line, and the static electricity is consumed on the anti-static line, which can effectively avoid the phenomenon of short circuit caused by electrostatic breakdown in the part at which the gate in the pixel unit is overlapped with the active layer in the preparation process, and can avoid electrostatic breakdown at the overlapping area between the anti-static line and the gate line, reduce the defect caused by short circuit between two layers of metal with an overlapping area, further effectively reduce the bright spot phenomenon caused by short circuit, and effectively improve the product yield.

Accordingly, the above array substrate further includes: buffer layers 10 arranged between the first metal layer and the metal oxide layer, and a gate insulating layer 12 arranged between the metal oxide layer and the second metal layer. The first metal layer, the buffer layers 10 and the metal oxide layer are stacked in sequence, the buffer layer acts as a barrier to separate the stacked first metal layer from the metal oxide, and the gate insulating layer acts as a barrier to separate the stacked metal oxide from the second metal layer.

In some embodiments, the metal oxide layer further includes a second active layer disposed in the sub-pixel unit, and the second metal layer further includes a first gate electrode 20 arranged in the sub-pixel unit and opposite to the second active layer 21; an interlayer insulating layer 19 is disposed on the second metal layer, and a third metal layer is disposed on the interlayer insulating layer 19, and the material of the third metal layer may be copper or aluminum; the third metal layer includes a first source electrode 17 and a first drain electrode 18 electrically connected with the second active layer, and the first gate electrode 20, the second active layer 21, the first source electrode 17 and the first drain electrode 18 constitute a second TFT, and the second TFT switch can be a pixel TFT switch in a sub-pixel circuit.

In some embodiments, a passivation layer 13 is disposed on the third metal layer, the material of the passivation layer 13 can be SiOx, and a thickness of the passivation layer 13 can be set to range from 3000 angstroms to 5000 angstroms.

In some embodiments, in the above array substrate, as to the setting of the first electrode 2 and the second electrode 5, a plurality of setting manners can be selected, such as the following manners.

Manner 1.

Figure 2:
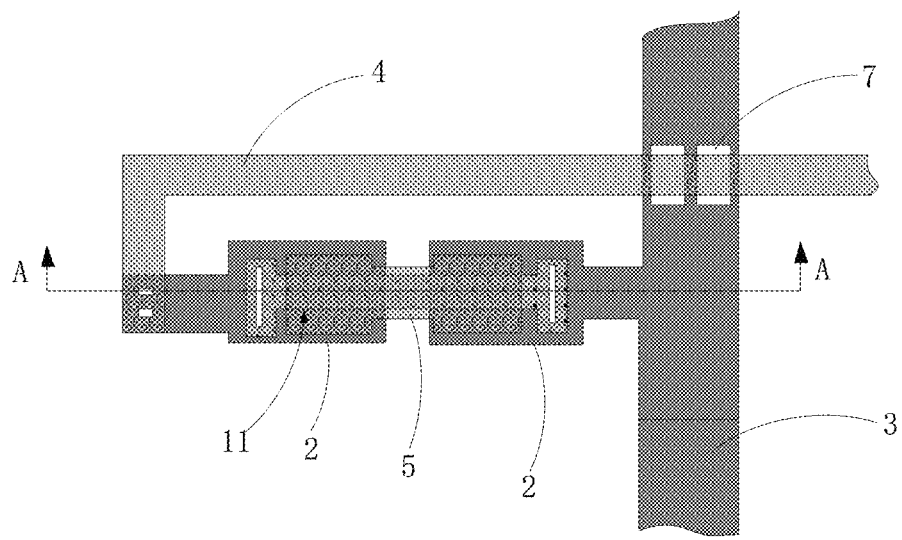
FIG. 2 is a schematic diagram of the partial structure of an array substrate provided in the embodiment of the present disclosure.
Figure 3A:
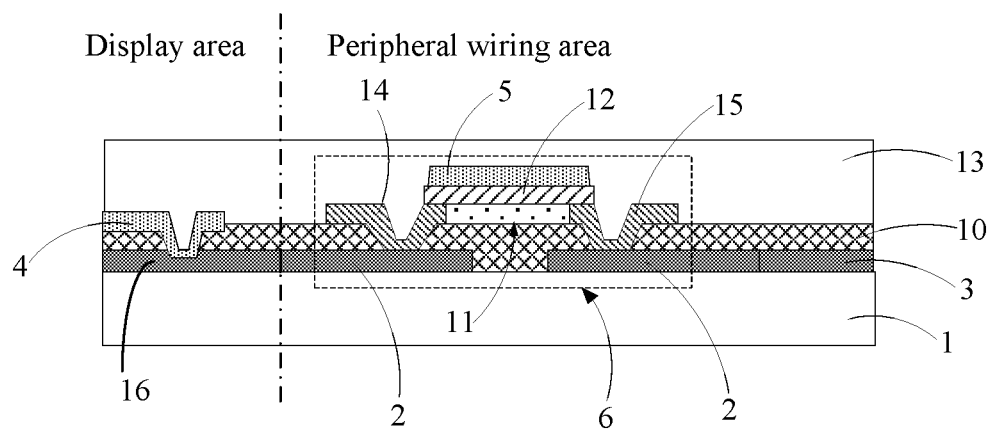
FIG. 3A is a schematic diagram of the cross-sectional structure along the A-A direction in FIG. 2.
Figure 3B:
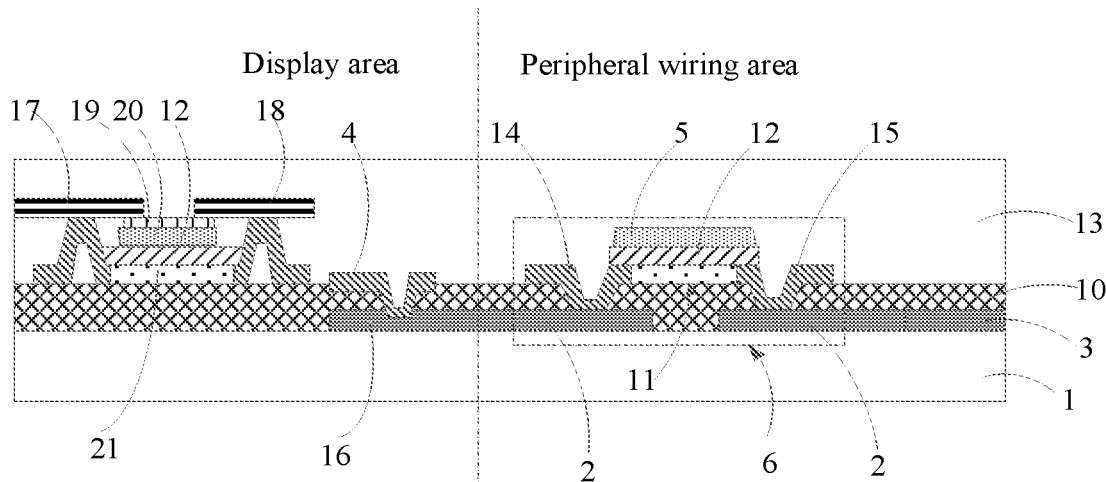
FIG. 3B is a schematic diagram showing a second TFT located in the display area on the basis of FIG. 3A.

As shown in FIG. 2 and FIGS. 3A-3B, the first electrode 2 can be set to form the source and drain electrodes of the first TFT6, and the second electrode 5 can be set to form the gate electrode of the first TFT6, that is, the first electrode 2 forms the source and drain electrode of the first TFT6, and the source and drain electrode of the first TFT6 are prepared in the same layer as the light shading metal 16 and the anti-static line 3, and the drain electrode of the first TFT6 is electrically connected with the anti-static line 3; the second electrode 5 is set to be the gate electrode of the first TFT6, the gate electrode of the first TFT6 is prepared in the same layer as the gate line 4, and the gate line 4 is electrically connected with the source electrode of the first TFT6.

Accordingly, in the above manner 1, in the first TFT, the conductive structure connecting the source and drain electrodes of the first TFT with the first active layer 11 may be part of the first active layer 11, the first active layer includes a channel region opposite to the gate electrode of the first TFT, and the channel region is provided with a first conductorization region 14 and a second conductorization region 15, respectively.

In some embodiments, the first conductorization region and the second conductorization region can be set to form the above conductive structure, the first conductorization region extends and is connected with the source electrode of the first TFT6 by extending into a first via hole, and the second conductorization region extends and is connected with the drain electrode of the first TFT by extending into a second via hole, then the first active layer is connected with the source and drain electrodes of the first TFT, and in addition, since the source and drain electrodes of the first TFT is prepared in the same layer as the anti-static line, therefore, when the pattern of the first metal layer is prepared, the drain electrode of the first TFT can be directly connected with the anti-static line, which is simple and reliable; as to the connection of the gate line to the source electrode of the first TFT, the gate line 4 can be set to be connected with the source electrode of the first TFT6 through a third via hole, which is simple and reliable.

Manner 2.

Figure 4:
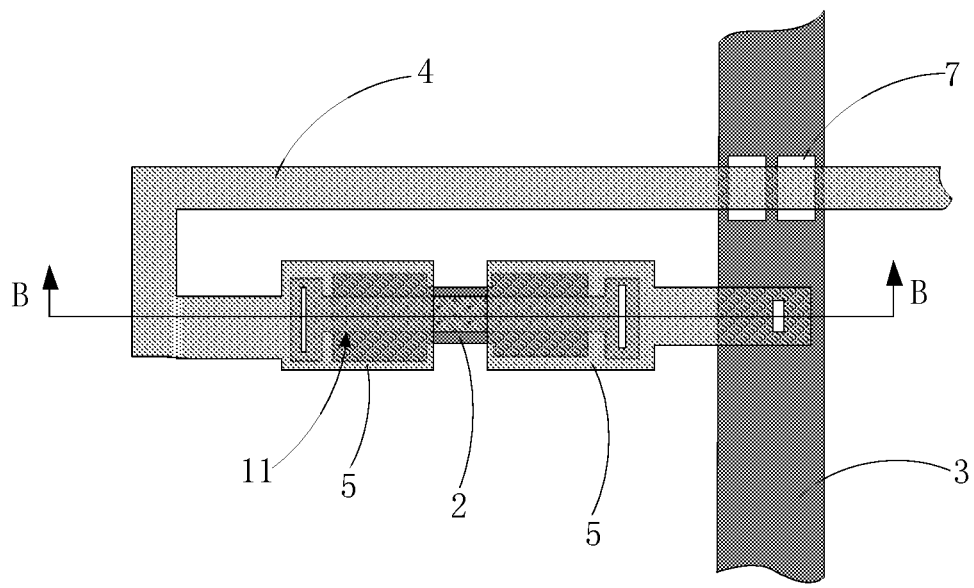
FIG. 4 is a schematic diagram of the partial structure of an array substrate provided in the embodiment of the present disclosure.
Figure 5:
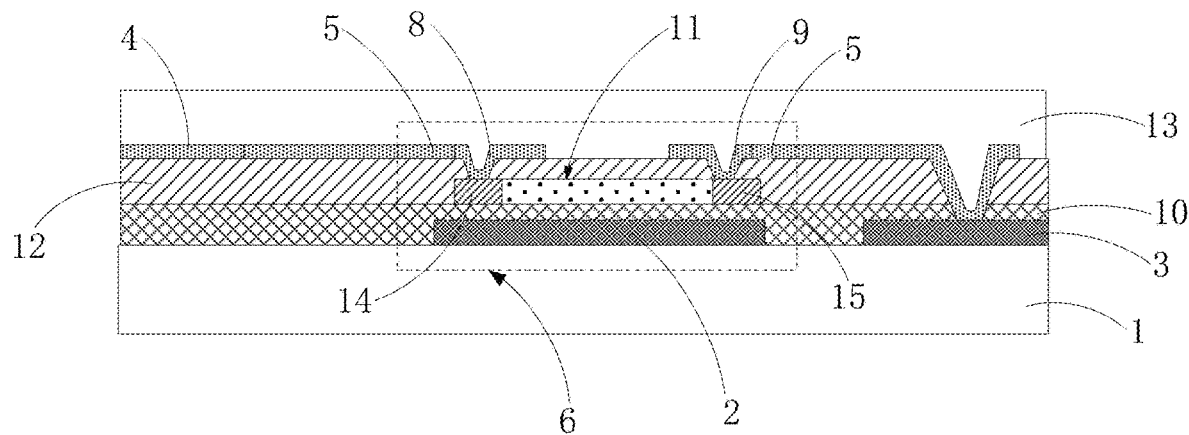
FIG. 5 is a schematic diagram of the cross-sectional structure along the B-B direction in FIG. 4.
Figure 6:
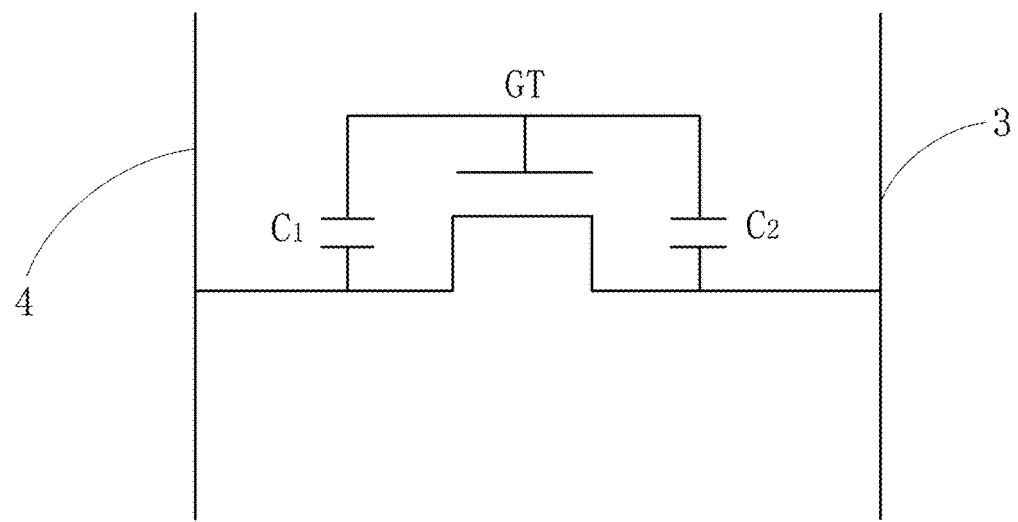
FIG. 6 is a schematic diagram of an equivalent circuit of a first TFT provided in the embodiment of the present disclosure.

As shown in FIG. 4 and FIG. 5, the first electrode 2 forms the gate electrode of the first TFT6, and the second electrode 5 forms the source and drain electrodes of the first TFT6, that is, the first electrode 2 is set as the gate electrode of the first TFT6, and the gate electrode of the first TFT6 is prepared in the same layer as the light shading metal 16 and the anti-static line 3; the second electrode 5 is set as the source and drain electrode of the first TFT6, and the source and drain electrode of the first TFT6 are prepared in the same layer as the gate line 4, the gate line 4 is electrically connected with the source electrode of the first TFT6, and the anti-static line 3 is electrically connected with the drain electrode of the first TFT6.

Accordingly, in the above manner 2, the first active layer 11 includes a channel region opposite to the gate electrode of the first TFT, and a first conductorization region 14 and a second conductorization region 15 arranged on two sides of the channel region, respectively, and a first connecting metal 8 and a second connecting metal 9 can also be formed in the second electrode 5, and the first connecting metal 8 and the second connecting metal 9 can constitute a conductive structure connecting the first active layer and the source and drain electrodes of the first TFT.

In some embodiments, the first connecting metal is directly connected to the source electrode of the TFT, and the first connecting metal can be directly connected with the first conductorization region 14 of the first active layer by extending into a fourth via hole, and the second connecting metal is directly connected to the drain electrode of the first TFT, and the second connecting metal can be connected with the second conductorization region 15 of the first active layer by extending into a fifth via hole; since the gate line and the source and drain electrodes of the first TFT are prepared on the same layer, the gate line can be set to be directly connected with the source electrode of the first TFT to achieve electrical connection, which is simple, reliable and easy to prepare; and the drain electrode of the first TFT can be connected with the anti-static line through the sixth via hole, which is simple in structure and easy to prepare.

Accordingly, in the above array substrate, a portion of an projection, in the direction vertical to the substrate, of the gate electrode of the first TFT6 and a portion of a projection, in the direction vertical to the substrate, of the source electrode of the first TFT6 have an overlapped area, that is, the gate electrode of the first TFT6 is set to be partially overlapped with the source electrode of the first TFT6 to form a first capacitor; and a portion of a projection, in the direction vertical to the substrate, of the gate electrode of the first TFT6 and a portion of a projection, in the direction vertical to the substrate, of the drain electrode of the first TFT6 have an overlapped area, that is, the gate electrode of the first TFT6 is set to be partially overlapped with the drain electrode of the first TFT6 to form a second capacitor.

As shown in FIG. 1, in the above array substrate, the anti-static line 3 is a ring-shaped line, and the anti-static line 3 is set around the display area of the substrate, the anti-static line 3 is directly set to be ring-shaped around the circumference of the display area of the substrate, and can better consume static electricity to eliminate static electricity.

As shown in FIG. 2, an orthographic projection of the gate line 4 on the substrate and an orthographic projection of the anti-static line 3 on the substrate have an overlapped area, and a hollow structure 7 is arranged at the overlapped area, and when the hollow structure 7 is arranged at the overlapped area, the generation of a parasitic capacitor at the part at which the anti-static line 3 is overlapped with the gate line 4 can be effectively avoided, and electrostatic breakdown can be effectively avoided.

The embodiments of present disclosure further provide a display panel, including any array substrate provided in the above technical solution.

The embodiments of present disclosure further provide a display device, including any display panel provided in the above technical solution.

Based on the same inventive concept, please refer to FIG. 1, FIG. 2 and FIGS. 3A-3B. the embodiments of present disclosure further provide a preparation method of any arbitrary array substrate provided in the above embodiment, including:

step S101, forming a first metal layer on a substrate, the first metal layer includes a light shading metal 16, a first electrode 2, and an anti-static line 3 arranged in a peripheral wiring area of the substrate;

step S102, forming a metal oxide layer above the first metal layer, wherein the metal oxide layer is isolated from the first metal layer, and the metal oxide layer includes a first active layer;

step S103, forming a second metal layer above the first metal layer, the second metal layer is isolated from the first metal layer, and the second metal layer includes a gate line 4 and a second electrode 5; and the gate line 4 is connected with the anti-static line 3 through a first TFT6, the first electrode, the first active layer and the second electrode constitute the first TFT6, one of the first electrode 2 and the second electrode 5 forms source and drain electrodes of the first TFT6, and the other of the first electrode and the second electrode forms the gate electrode of the first TFT6; the first active layer is connected with the source and drain electrodes of the first TFT through a conductive structure, and a distance between a surface, facing away from the substrate, of the conductive structure and the substrate is less than or equal to a distance between a surface, facing away from the substrate, of the second metal layer and the substrate; the source electrode of the first TFT6 is electrically connected with the gate line 4, and the drain electrode of the first TFT6 is electrically connected with the anti-static line 3; and a first capacitor is formed between the gate electrode of the first TFT6 and the source electrode of the first TFT6, and a second capacitor is formed between the gate electrode of the first TFT6 and the drain electrode of the first TFT6.

In the preparation process of the above preparation method, the overall anti-static structure is simple and compact, the preparation process is less, with no need of spanning the preparation of multiple conductive layers, and when the gate line is formed, the anti-static structure is also formed, so that the static electricity accumulated in the dry etching or exposure process during the preparation process can be evacuated from the gate line to the anti-static line, and the static electricity is consumed on the anti-static line, which can effectively avoid the phenomenon of short circuit caused by electrostatic breakdown in the part at which the gate in the pixel unit is overlapped with the active layer in the preparation process, and can avoid electrostatic breakdown at the overlapping area between the anti-static line and the gate line, reduce the defect caused by short circuit between two layers of metal with an overlapping area, further effectively reduce the bright spot phenomenon caused by short circuit, and effectively improve the product yield.

As shown in FIGS. 3A 3B, the above preparation method further includes:

forming a buffer layer 10 above the first metal layer after forming the first metal layer and before forming the metal oxide layer;

forming a gate insulating layer 12 on the metal oxide layer after forming the metal oxide layer and before forming the second metal layer.

In some embodiments, in the patterned preparation of the second metal layer, the gate line 4, the second electrode 5 and the first gate electrode can be formed simultaneously, and the first gate electrode is arranged in the display area.

In some embodiments, in the patterned preparation of the metal oxide layer, the first active layer and the second active layer can be formed simultaneously, with the second active layer disposed in the sub-pixel unit, thereby simplifying the preparation process. In some embodiments, as shown in FIGS. 3A-3B, the above preparation method further includes: forming an interlayer insulating layer above the second metal layer after forming the second metal layer;

and then forming a third metal layer above the interlayer insulating layer 19, wherein the third metal layer includes a first source electrode 17 and a first drain electrode 18, the first source electrode 17, the first drain electrode and the second active layer 21 are electrically connected, the first gate electrode 20, the second active layer 21, the first source electrode 17 and first drain electrode 18 may constitute a second TFT, the second TFT may be formed as a pixel TFT switch in a pixel circuit; for example, the material of the third metal layer may be copper or aluminum;

afterwards, forming a passivation layer 13 above the third metal layer, the material of the passivation layer 13 can be SiOx, and the thickness of the passivation layer 13 can be set to range from 3000 angstroms to 5000 angstroms.

Evidently, those skilled in the art can make various modifications and variations to the embodiments of the present disclosure without departing from the spirit and scope of the present disclosure. Accordingly, the present disclosure is also intended to encompass these modifications and variations thereto so long as the modifications and variations of the present disclosure come into the scope of the claims appended to the present disclosure and their equivalents.

What is claimed is:

1. An array substrate, comprising:
a substrate,
a first metal layer,
a metal oxide layer, and
a second metal layer
wherein the first metal layer, the metal oxide layer, and the second metal layer are sequentially stacked on the substrate;
the first metal layer comprises:
  a light shading metal,
  a first electrode, and
  an anti-static line arranged in a peripheral wiring area of the substrate;
the metal oxide layer comprises:
  a first active layer;
the second metal layer comprises:
  a gate line, and
  a second electrode;
wherein the anti-static line comprises a first anti-static line surrounding a display area and a second anti-static line, the first anti-static line is connected with the second anti-static line through a third TFT, the gate line is connected with the first anti-static line through a first TFT, and the first electrode, the first active layer and the second electrode constitute the first TFT;
one of the first electrode and the second electrode forms source and drain electrodes of the first TFT, and another one of the first electrode and the second electrode forms a gate electrode of the first TFT;
the first active layer is connected with the source and drain electrodes of the first TFT through a conductive structure, and a distance between a surface, facing away from the substrate, of the conductive structure and the substrate is less than or equal to a distance between a surface, facing away from the substrate, of the second metal layer and the substrate;
the source electrode of the first TFT is electrically connected with the gate line, and the drain electrode of the first TFT is electrically connected with the first anti-static line;
a first capacitor is formed between the gate electrode of the first TFT and the source electrode of the first TFT, and a second capacitor is formed between the gate electrode of the first TFT and the drain electrode of the first TFT; and
the first active layer comprises a channel region opposite to the gate electrode of the first TFT, and a first conductorization region and a second conductorization region arranged on two sides of the channel region, respectively, the first conductorization region and the second conductorization region constitute the conductive structure, and an orthographic projection the gate electrode of the first TFT on the substrate covers at least a portion of the first conductorization region and a portion of the second conductorization region.

2. The array substrate of claim 1, wherein the first electrode forms the source and drain electrodes of the first TFT, and the second electrode forms the gate electrode of the first TFT.

3. The array substrate of claim 2,
wherein the first conductorization region is connected with the source electrode of the first TFT, and the second conductorization region is connected with the drain electrode of the first TFT.

4. The array substrate of claim 1, wherein the first electrode forms the gate electrode of the first TFT, and the second electrode forms the source and drain electrodes of the first TFT.

5. The array substrate of claim 4, wherein the first active layer comprises:
a channel region opposite to the gate electrode of the first TFT, and
a first conductorization region and a second conductorization region arranged on two sides of the channel region, respectively;
wherein the second electrode is formed with a first connecting metal and a second connecting metal, the first connecting metal and the second connecting metal constitute the conductive structure, the first connecting metal is connected with the first conductorization region, and the second connecting metal is connected with the second conductorization region.

6. The array substrate of claim 1, wherein:
the gate electrode of the first TFT is partially overlapped with the source electrode of the first TFT to form the first capacitor; and
the gate electrode of the first TFT is partially overlapped with the drain electrode of the first TFT to form the second capacitor.

7. The array substrate of claim 1, wherein the first anti-static line is a ring-shaped line, and the first anti-static line is arranged around a display area of the array substrate.

8. The array substrate of claim 1, wherein:
an orthographic projection, on the substrate, of the gate line and an orthographic projection, on the substrate, of the first anti-static line have an overlapped area; and
a hollow structure is arranged at the overlapped area.

9. The array substrate of claim 1, further comprising:
a buffer layer between the first metal layer and the metal oxide layer; and
a gate insulating layer between the metal oxide layer and the second metal layer.

10. The array substrate of claim 9, wherein the metal oxide layer further comprises a second active layer disposed in a sub-pixel unit of the array substrate;

the second metal layer further comprises a first gate electrode arranged in the sub-pixel unit and opposite to the second active layer;

an interlayer insulating layer is disposed on the second metal layer, a third metal layer is disposed on the interlayer insulating layer, and the third metal layer comprises a first source electrode and a first drain electrode electrically connected with the second active layer.

11. The array substrate of claim 10, further comprising a passivation layer disposed on the third metal layer.

12. The array substrate of claim 11, wherein a thickness of the passivation layer ranges from 3000 angstroms to 5000 angstroms.

13. A display panel, comprising the array substrate of claim 1.

14. A display device, comprising the display panel of claim 13.

15. A method for preparing the array substrate of claim 1, the method comprising:

forming the first metal layer on the substrate, wherein the first metal layer comprises the light shading metal, the first electrode, and the anti-static line, and the anti-static line is arranged in the peripheral wiring area of the substrate;

forming the metal oxide layer above the first metal layer, wherein the metal oxide layer is isolated from the first metal layer, and the metal oxide layer comprises the first active layer;

forming the second metal layer above the first metal layer, wherein the second metal layer is isolated from the metal oxide layer, and the second metal layer comprises the gate line and the second electrode;

wherein the anti-static line comprises a first anti-static line surrounding a display area and a second anti-static line, the first anti-static line is connected with the second anti-static line through a third TFT, the gate line is connected with the first anti-static line through the first TFT, the first electrode, the first active layer and the second electrode constitute the first TFT, one of the first electrode and the second electrode forms source and drain electrodes of the first TFT, and another one of the first electrode and the second electrode forms the gate electrode of the first TFT; the first active layer is connected with the source and drain electrodes of the first TFT through the conductive structure, and the distance between the surface, facing away from the substrate, of the conductive structure and the substrate is less than or equal to the distance between the surface, facing away from the substrate, of the second metal layer and the substrate; the source electrode of the first TFT is electrically connected with the gate line, and the drain electrode of the first TFT is electrically connected with the first anti-static line; and the first capacitor is between the gate electrode of the first TFT and the source electrode of the first TFT, and the second capacitor is between the gate electrode of the first TFT and the drain electrode of the first TFT, the first active layer comprises a channel region opposite to the gate electrode of the first TFT, and a first conductorization region and a second conductorization region arranged on two sides of the channel region, respectively, the first conductorization region and the second conductorization region constitute the conductive structure, and an orthographic projection the gate electrode of the first TFT on the substrate covers at least a portion of the first conductorization region and a portion of the second conductorization region.

16. The method of claim 15, further comprising:

forming a buffer layer above the first metal layer after forming the first metal layer and before forming the metal oxide layer; and forming a gate insulating layer on the metal oxide layer after forming the metal oxide layer and before forming the second metal layer.

17. The method of claim 15, further comprising:

forming an interlayer insulating layer above the second metal layer after forming the second metal layer; and forming a third metal layer above the interlayer insulating layer, wherein the third metal layer comprises a first source electrode and a first drain electrode; wherein the metal oxide layer comprises a first active layer disposed in a sub-pixel unit of the array substrate, the first source electrode, the first drain electrode and a second active layer are electrically connected.

18. The method of claim 17, further comprising:

forming a passivation layer above the third metal layer.

* * * * *